United States Patent
Thakur

(10) Patent No.: US 6,635,568 B2
(45) Date of Patent: *Oct. 21, 2003

(54) REFRACTORY METAL ROUGHNESS REDUCTION USING HIGH TEMPERATURE ANNEAL IN HYDRIDES OR ORGANO-SILANE AMBIENTS

(75) Inventor: Randhir P. S. Thakur, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 57 days.

This patent is subject to a terminal disclaimer.

(21) Appl. No.: 09/949,416

(22) Filed: Sep. 7, 2001

(65) Prior Publication Data

US 2002/0006722 A1 Jan. 17, 2002

Related U.S. Application Data

(62) Division of application No. 09/483,839, filed on Jan. 17, 2000, now Pat. No. 6,300,243, which is a division of application No. 08/649,902, filed on May 15, 1996, now Pat. No. 6,028,002.

(51) Int. Cl.$^7$ .............................................. H01L 21/44
(52) U.S. Cl. ...................... 438/647; 438/648; 438/649
(58) Field of Search ......................... 438/647; 570/77, 570/15; 580/77, 88

(56) References Cited

U.S. PATENT DOCUMENTS

| | | | |
|---|---|---|---|
| 4,987,470 A | 1/1991 | Suzuki et al. .................. 357/49 |
| 5,460,999 A | 10/1995 | Hong et al. .................... 437/60 |
| 5,473,176 A | 12/1995 | Kakumoto .................... 257/192 |
| 5,612,249 A | 3/1997 | Sun et al. ...................... 437/69 |
| 5,681,778 A | 10/1997 | Manning .................... 437/186 |
| 5,731,610 A | 3/1998 | Rhodes ........................ 257/309 |
| 5,780,362 A | 7/1998 | Wang et al. ................. 438/683 |
| 5,798,278 A | 8/1998 | Chan et al. .................. 438/655 |
| 5,852,311 A | 12/1998 | Kwon et al. ................. 257/315 |
| 5,897,352 A | 4/1999 | Lin et al. ..................... 438/255 |
| 5,945,707 A | 8/1999 | Bronner et al. ............. 257/330 |
| 6,093,642 A | * 7/2000 | Cho et al. ................... 438/643 |
| 6,198,143 B1 | * 3/2001 | Ohsaki ........................ 257/412 |
| 6,291,340 B1 | * 9/2001 | Sandhu et al. .............. 438/637 |

OTHER PUBLICATIONS

"Boundary Conditions to Oxidation of $WSi_2$/Polysilicon Structure" 1989 Materials Research Society.

(List continued on next page.)

Primary Examiner—David Nelms
Assistant Examiner—Thao Le

(57) ABSTRACT

An embodiment of the present invention teaches a method used in a semiconductor fabrication process to form a memory cell in a semiconductor device comprising the steps of: subjecting a layered structure comprising a silicon gate insulating layer, a conductively doped polysilicon gate layer and a refractory metal silicide gate film to a thermal processing step; forming a sheet resistance capping layer directly on the refractory metal silicide film during at least a period of time of the thermal processing step, the sheet resistance capping layer forming a substantially uniform surface on the refractory metal silicide film; patterning and etching the layered structure to form the transistor gate; forming source and drain regions aligned to opposing sides of the transistor gate and formed into an underlying silicon substrate; and forming a storage capacitor (such as a stacked capacitor or a container cell) connecting to one of the source and drain regions. The thermal processing step is performed in a variety of ambients, such as hydrides oxygen/ozone ambients, for a first portion of the time period. In addition, an organo-silane ambient in the later half of the thermal cycle may also be used.

24 Claims, 2 Drawing Sheets

OTHER PUBLICATIONS

"Thermal Oxidation of Silicides" j. Appl. Phys. 56(7), Oct. 1, 1984.

"Decrease of Gate Oxide Dielectric Constant in Tungsten Polycide Gate Processes" IEEE Electron Device Letters, vol. 14, No. 5, May 1993.

"Removal of the Process–Induced Fluorine Associated to Chemical Vapor Deposition of Tungsten Onto a Polycrystalline Silicon . . . " J. Appl. Phys. 68 (5), Sep. 1, 1990.

"Oxidation Phenomena Polysilicon/Tungsten Silicide Structures" J. Electrochem. Soc.: Solid–State Science and Technology Jan. 1984.

"Phosphorus Redistribution in a $WSi_2$/Polysilicon–Silicon Gate Structure During Furnace Annealing" J. Appl. Phys. 63 (3), Feb. 1, 1988.

"Thermodynamic Considerations in Refractory Metal–Silicon–Oxygen Systems" J. Appl. Phys. 56 (1), Jul. 1, 1984.

"Properties of Low–Pressure CVD Tungsten Silicide for MOS VLSI Interconnections" IEEE Transaction on Electron Devices, vol. ED–30, No. 11, Nov. 1983.

"ION Implantation of Arsenic in Chemical Vapor Deposition Tungsten Silicide".

* cited by examiner

REFRACTORY METAL ROUGHNESS REDUCTION USING HIGH TEMPERATURE ANNEAL IN HYDRIDES OR ORGANO-SILANE AMBIENTS

This application is a divisional to U.S. patent application Ser. No. 09/483,839, filed Jan. 17, 2000, which is a divisional to Ser. No. 08/649,902, now U.S. Pat. No. 6,028,002, filed May 5, 1996.

FIELD OF THE INVENTION

This invention relates to semiconductor technology, and more specifically, to a method to reduce refractory metal roughness.

BACKGROUND OF THE INVENTION

In the fabrication of semiconductor wafers, the photolithography steps are critical when patterning the minimum feature width, dictated by given photolithography equipment, onto a wafer. Several factor come into play that will affect the dimension and profile of a structure that has resulted from the photolithography steps performed.

One factor is the quality of the masking material (photoresist) itself. Another factor is the effectiveness of the light source (usually ultraviolet light) to expose the photoresist in direct correlation to an overlying mask or reticle. Though, the photoresist quality must continually be monitored and improvements made, the exposure of the photoresist to a light source to provide the desired patterned, is an area where major engineering efforts are ongoing.

The effectiveness of proper light exposure of the photoresist, not only depends on the photoresist material itself, but also on other factors such as the type of underlying film that is being patterned. Maintaining a desired profile becomes even more difficult when patterning a material having a rough surface, such as a refractory metal that is made rough by the shape of its grains.

When patterning a refractory metal, the unevenness of the grains results in the film possessing non-uniform adsorption and reflective properties to light. During a photo step, these non-uniform properties to light result in the light reflecting back into the photoresist at varying angles to cause reflective notching of the photoresist. Though reflective notching can be caused by any underlying film that is being patterned, it is a major problem when patterning the rough surfaced refractory metal.

Another challenge that is presented by the uneven grain of a refractory metal presents, comes to play during the etching step. Usually it is desired to obtain the most vertical profile as possible. However, the uneven grains of the refractory metal silicide, cause the vertical profile to become jagged and less vertical, both undesirable results.

What is needed is a method that addresses the patterning and etching of a refractory metal to obtain structures having a substantially vertical profile. The present invention teaches such a method that may be used in semiconductor processes, such as fabrication processes for Dynamic Random Access Memory (DRAM), Static Random Access Memory (SRAM) and the like.

SUMMARY OF THE INVENTION

In general, the present invention includes a method for forming a refractory metal structure or a refractory metal silicided structure having substantially uniform reflective light properties. In one preferred implementation, the method includes; subjecting a refractory metal silicided layer to a thermal processing step; and of forming a layer, having relatively uniform reflective characteristics to ultraviolet light, directly on the refractory metal silicided layer during the thermal processing step. Preferably, the thermal processing step will be selected to adjust the grain size of the refractory metal to the desired size. The layer formed over the refractory metal can either be formed during the thermal processing step, or can be formed subsequently. In many applications, after the thermal processing step and the formation of the cap layer, the two layers, and possibly other underlying layers, may be patterned to form selected features.

DETAILED DESCRIPTION OF THE INVENTION

Figure 1A:
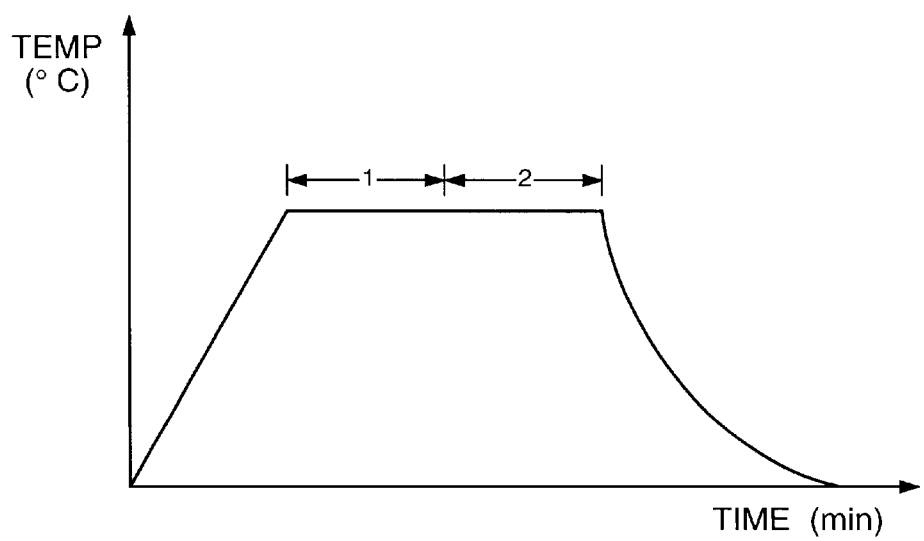
FIGS. 1A and 1B graphically depict thermal processing cycles used with respect to the process steps of the present invention.
Figure 1B:
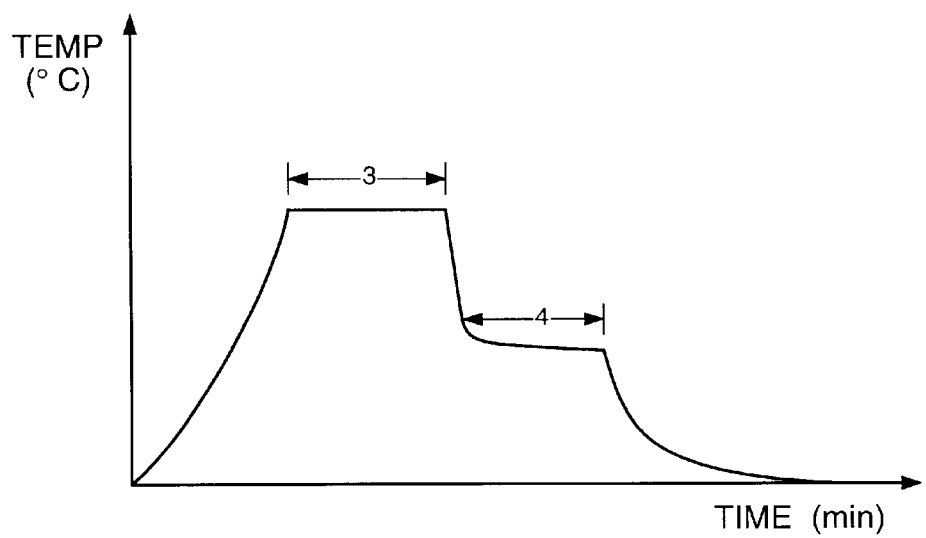
Figure 2:
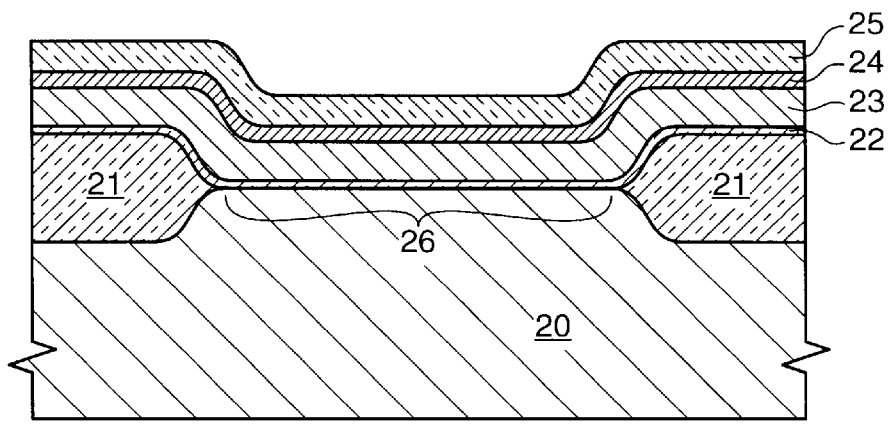
FIG. 2 depicts an in-process wafer assembly having exemplary transistor gate stack layers formed thereon, illustrated in a vertical cross-section.
Figure 3:
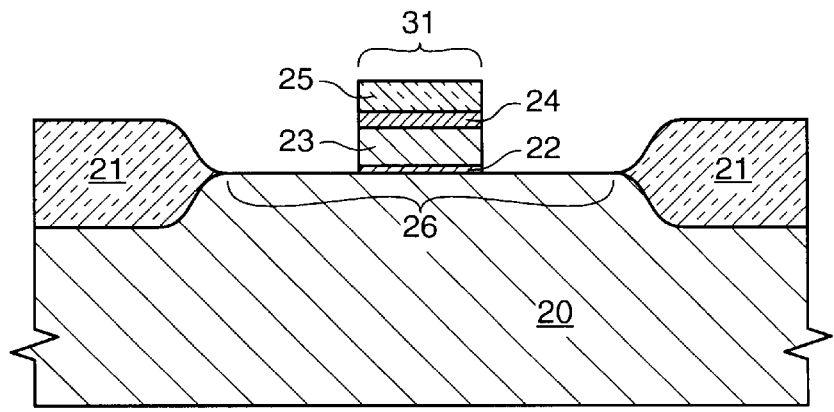
FIG. 3 depicts the in-process wafer assembly of FIG. 2 after a transistor gate stack structure is exposed to a photolithography patterning step and to an etching step.
Figure 4:
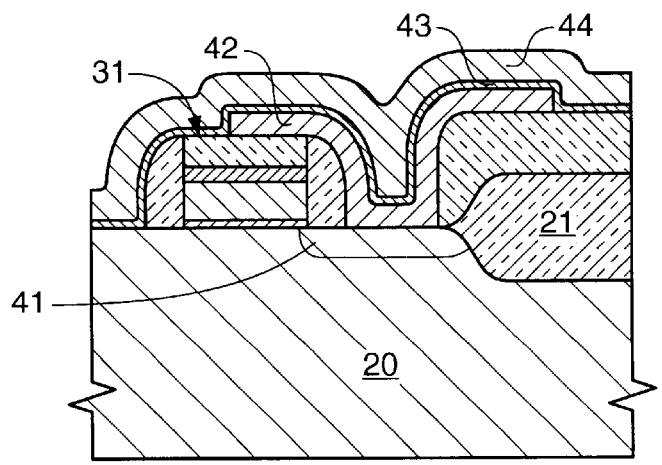
FIG. 4 depicts the in-process wafer assembly of FIG. 3 after process steps have been performed to form source/drain regions to the transistor gate stack and a storage capacitor connected to one of the source/drain regions of the access transistor.

Thermal processing steps for forming a refractory metal silicided structure of the present invention are demonstrated in FIGS. 1A and 1B. FIGS. 2–4 depict exemplary embodiments of the present invention when applied to specific applications.

Referring now to FIG. 2, substrate 20 (such as silicon or other semiconductor substrates) has substrate region 26 separated by field oxide regions 21. Oxide insulative layer 22 is formed conformally over substrate region 26 and field oxide regions 21. A conformal, conductively-doped, polysilicon layer 23 is formed over insulator layer 22 and a conformal refractory metal silicide layer 24 is formed over conductive layer 23.

In a preferred embodiment, it is desired that the refractory metal silicide to be formed is either titanium silicide or tungsten silicide. If tungsten silicide is selected, then in preparation of tungsten silicide deposition, the surface of polysilicon layer 23 is cleaned with hydrofluoric acid to remove any native oxide to enhance adhesion between polysilicon layer 23 and the subsequently deposited tungsten silicide layer (which will become refractory metal silicide layer 24). If the structure is to be used as a transistor gate, it is preferred that approximately 1200 angstroms of tungsten silicide be deposited on polysilicon layer 23. During deposition, silane gas is reacted with tungsten hexafluoride in a deposition chamber at 410° C. to form the tungsten silicide. The low resistivity of the deposited tungsten silicide enhances the operating speed of the transistor.

The stacked structure of FIG. 2, which includes layers 22, 23 and 24, is subjected to the thermal processing cycle of either FIGS. 1A and 1B. Taking the case when the stacked structure of FIG. 2 is subjected to the thermal processing cycle of FIG. 1A, during period 1 the structure is annealed at a desired temperature that will adjust the grain size of refractory metal silicide layer 24, which in turn sets the resistivity of (sheet resistance) of layer 24. During this same thermal cycle, during period 2, a capping layer 25 (in FIG. 2) is conformally deposited over layer 24. The advantage and importance of this capping layer 25 will become apparent as the method is further described.

As show in FIG. 1B, the thermal cycle may be adjusted so that the annealing period 3 occurs at a higher temperature than the temperature used to deposit capping layer 25, during period 4. It is important that the annealing period occurs before the deposition period and at a high enough temperature in order to adjust the refractory metal grain size in order to set the resistance of the refractory metal silicided structure. The second period may overlap the first period, however, it is preferred that the deposition of the capping layer be at least a major portion of the later half of the entire thermal cycle and it is still further preferred that the deposition of the capping layer comprises a major portion of the entire thermal cycle.

The thermal processing cycle may be performed in a rapid thermal process system, in plasma annealing or in a furnace, and at a preferred operating temperature ranging from 600–1050° C.

During the deposition period several ambients may be employed, such as organo-silane ambient or a hydride ambient to form a capping material of silicon, silicon oxide or silicon nitride, as desired. Also, doped glass layers, including BPSG, PSG, BSG, etc:, may be used. However, it is preferred that capping material be a doped polysilicon.

A preferred way to form the doped polysilicon comprises feeding organo-SILANE into a deposition chamber with the deposition temperature set at between 450–800° C. Along with the organo-silane, phosphorus dopants are also fed into the chamber. The organo-silane reacts with the heated refractory metal silicide to form an insitu-doped polysilicon capping layer. Though it is preferred, the polysilicon layer need not be in situ doped, as it may be doped after the polysilicon is formed. By selecting polysilicon as the capping layer the resistance of the silicide structure is further reduced, which would be advantageous if this structure is used as a transistor gate.

Referring now to FIG. 3, the stacked structure, now comprising layers 22, 23, 24 and 25, is patterned and etched to form metal silicided structure 31. As mentioned, the presence of capping layer provides some definite advantages when constructing metal silicided structure 31.

One advantage is that capping layer 25 will smooth the surface of metal silicide layer 24, which is inherently rough due to the graininess of refractory metal. Another advantage of capping layer 25 is that it will cancel much of the reflective properties of the refractory metal silicide. Both of these inherent light properties of layer 25, surface smoothness and reduced reflectivity to the electromagnetic spectrum of light (such as ultraviolet), become a enhancing aid when patterning and etching metal silicided structure 31.

First, during patterning, when a photomask is formed by exposing photoresist to ultraviolet light a more precise photomask pattern is obtained as capping layer 25, having a smooth surface, will reduce the light that is reflected back into the photoresist (reducing reflective notching of the photoresist) and thus maintaining the desired photomask pattern.

Second, during the etching of structure 31, because the graininess of the refractory metal silicide layer 24 is now capped with the substantially smooth surface of layer 25 (smooth with respect to layer 24), the subsequent etch will provide sidewall profiles (or substantially uniform etch profiles) that are more vertically uniform than can be acquired when etching several layers that are covered with refractory metal silicide alone.

For example, during a plasma etch, the etch continues in a substantially anisotropic direction until completed, because layer 25 has uniform light absorption and minimum light interference properties, in comparison to those properties inherent in refractory metal silicide layer 24. The process to form structure 31 may be utilized in any fabrication process that employs a refractory metal silicide structure.

For example, the present invention lends itself to a method of patterning a transistor gate in a semiconductor device. First, a layered structure comprising a silicon gate insulating layer, a conductively doped polysilicon gate layer and a refractory metal silicide gate film, is subjected to a thermal processing step. Next, a sheet resistance capping layer is formed directly on the refractory metal silicide film during at least a period of time of the thermal processing step. The sheet resistance capping layer forms a substantially uniform surface on the refractory metal silicide film and after, patterning and etching steps, the resulting patterned, layered, structure forms the transistor gate.

The above process could be expanded to form a memory cell (as depicted in FIG. 4) by forming diffusion region 41, forming storage plate 42 connecting to a diffusion region 41 (source and drain regions of a transistor), covering storage plate 42 with capacitor dielectric 43 and forming the top capacitor plate 44 to complete the memory cell. The process may be used for a stacked capacitor process or a container cell capacitor process. Furthermore, though the embodiments are described in terms of improving the profile of a refractory metal silicide structure during patterning and etching, the disclosed patterning and etching process will also enhance the profile of a refractory metal structure.

Although the present invention is described in various embodiments, it will be apparent to one skilled in the art that changes and modifications may be made thereto without departing from the spirit and scope of the invention as claimed.

What is claimed is:

1. A method for reducing the roughness of a refractory metal silicide structure during semiconductor fabrication comprising the steps of:

subjecting a structure having a refractory metal silicide film thereon to a thermal processing step;

forming a sheet resistance capping layer directly on said refractory metal silicide film during at least a period of time of said thermal processing step, said sheet resistance capping layer forming a substantially uniform surface on said refractory metal silicide film.

2. The method of claim 1, wherein said thermal processing step is performed in a hydride ambient.

3. The method of claim 1, wherein said thermal processing step is performed in an organo-silane ambient.

4. The method of claim 1, wherein said period of time comprises at least a major portion of the later half of said thermal cycle.

5. The method of claim 1, wherein said period of time comprises a major portion of the entire said thermal cycle.

6. The method of claim 1, wherein said thermal processing cycle comprises a process selected from the group consisting of rapid thermal process annealing, plasma annealing and furnace annealing.

7. The method of claim 1, wherein said thermal processing cycle comprises an operating temperature range of 600–1050° C.

8. A method for etching a refractory metal silicided structure during semiconductor fabrication comprising the steps of:

subjecting said refractory metal silicided structure to a thermal processing step;

forming a sheet resistance capping layer directly on the surface of said refractory metal silicided structure during at least a period of time of said thermal processing step, said sheet resistance capping layer forming a substantially uniform surface on said refractory metal silicide film;

patterning and etching said refractory metal silicided structure having said sheet resistance capping layer thereon.

9. The method of claim 8, wherein said thermal processing step is performed in a hydride ambient.

10. The method of claim 8, wherein said thermal processing step is performed in an organo-silane ambient.

11. The method of claim 8, wherein said period of time comprises at least a major portion of the later half of said thermal cycle.

12. The method of claim 8, wherein said period of time comprises a major portion of the entire said thermal cycle.

13. The method of claim 8, wherein said thermal processing cycle comprises a process selected from the group consisting of rapid thermal process annealing, plasma annealing and furnace annealing.

14. The method of claim 8, wherein said thermal processing cycle comprises an operating temperature range of 600–1050° C.

15. A method for forming a refractory metal structure having substantially uniform reflectivity, said method comprising the steps of:

subjecting a refractory metal layer to a thermal processing step;

forming a layer having relatively uniform reflective characteristics to light directly on said refractory metal layer during said thermal processing step.

16. The method of claim 15, wherein said light comprises the electromagnetic light spectrum.

17. The method of claim 16, wherein said thermal processing step comprises at least first and second annealing periods.

18. The method of claim 17, wherein said first and second anneal periods overlap.

19. The method of claim 17, wherein said second anneal period follows said first anneal period.

20. The method of claim 17, wherein said first and second anneal periods are performed at approximately the same temperature.

21. The method of claim 17, wherein said first and second anneal periods are performed at different temperatures.

22. The method of claim 15, wherein said thermal processing cycle comprises a process selected from the group consisting of rapid thermal process annealing, plasma annealing and furnace annealing.

23. The method of claim 15, wherein said thermal processing cycle comprises an operating temperature range of 600–1050° C.

24. The method of claim 15, wherein said layer is a material selected from a group consisting of silicon, silicon oxide, silicon nitride, BPSG, PSG, BSG and conductively doped polysilicon.

* * * * *